(12) United States Patent
Kearney et al.

(10) Patent No.: US 10,699,986 B2
(45) Date of Patent: Jun. 30, 2020

(54) COOLED ELECTRONICS PACKAGE WITH STACKED POWER ELECTRONICS COMPONENTS

(71) Applicant: ABB Schweiz AG, Baden (CH)

(72) Inventors: Daniel Kearney, Zürich (CH); Jürgen Schuderer, Zürich (CH); Slavo Kicin, Zürich (CH); Liliana Duarte, Opfikon (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/233,266

(22) Filed: Dec. 27, 2018

(65) Prior Publication Data

US 2019/0131211 A1     May 2, 2019

Related U.S. Application Data

(63) Continuation of application No. PCT/EP2017/065743, filed on Jun. 26, 2017.

(30) Foreign Application Priority Data

Jun. 28, 2016    (EP) .................................... 16176641

(51) Int. Cl.
*H01L 23/34* (2006.01)
*H01L 23/473* (2006.01)
(Continued)

(52) U.S. Cl.
CPC .......... *H01L 23/473* (2013.01); *H01L 25/071* (2013.01); *H05K 1/0203* (2013.01); (Continued)

(58) Field of Classification Search
CPC ... H01L 23/473; H01L 25/071; H05K 1/0203; H05K 1/0272
(Continued)

(56) References Cited

U.S. PATENT DOCUMENTS 8,421,235 B2\* 4/2013 Ide ........................ H01L 23/473
                                                         257/675
8,810,026 B2\* 8/2014 Kadoguchi ............. H01L 23/34
                                                         257/712
(Continued)

FOREIGN PATENT DOCUMENTS

EP      2849223 A2    3/2015
WO   2009143682 A1   12/2009
(Continued)

OTHER PUBLICATIONS

European Patent Office, International Search Report & Written Opinion issued in corresponding Application No. PCT/EP2017/065743, dated Sep. 13, 2017, 10 pages.
(Continued)

*Primary Examiner* — Luan C Thai
(74) *Attorney, Agent, or Firm* — Taft Stettinius & Hollister LLP; J. Bruce Schelkopf

(57) ABSTRACT

An electronics package includes an electrically conducting support layer; at least one electrically conducting outer layer; at least two power electronics components arranged on different sides of the support layer and electrically interconnected with the support layer and with the at least one outer layer; and isolation material, in which the support layer and the at least two power electronics components are embedded, the support layer and the at least one outer layer are laminated together with the isolation material; and a cooling channel for conducting a cooling fluid through the electronics package, the cooling channel runs between the at least two power electronics components through the support layer.

20 Claims, 2 Drawing Sheets

(51) Int. Cl.
    H01L 25/07    (2006.01)
    H05K 1/02     (2006.01)
    H01L 23/538   (2006.01)
    H05K 1/18     (2006.01)

(52) U.S. Cl.
    CPC ........ *H05K 1/0272* (2013.01); *H01L 23/5386* (2013.01); *H05K 1/185* (2013.01); *H05K 2201/064* (2013.01); *H05K 2201/10166* (2013.01)

(58) Field of Classification Search
    USPC .......................................... 257/714
    See application file for complete search history.

(56) References Cited

U.S. PATENT DOCUMENTS

| | | |
|---|---|---|
| 8,811,019 B2 | 8/2014 | Gottwald et al. |
| 2008/0286531 A1 | 11/2008 | Son |
| 2009/0108435 A1 | 4/2009 | Bernstein et al. |
| 2012/0001341 A1 | 1/2012 | Ide et al. |
| 2012/0228779 A1 | 9/2012 | King, Jr. et al. |
| 2013/0199829 A1 | 8/2013 | Gottwald |
| 2017/0127524 A1 | 5/2017 | Gottwald et al. |

FOREIGN PATENT DOCUMENTS

| | | |
|---|---|---|
| WO | 2012072212 A2 | 6/2012 |
| WO | 2012175207 A2 | 12/2012 |
| WO | 2013000574 A1 | 1/2013 |

OTHER PUBLICATIONS

Hoene et al., "Packaging Very Fast Switching Semiconductors," CIPS 2014, Feb. 25-27, 2014, Nuremberg/Germany, 7 pp.

Kearney et al., "A liquid cooling solution for temperature redistribution in 3D IC architectures," Microelectronics Journal, vol. 43, 2012, pp. 602-610.

Kearney et al., "A numerical hydrodynamic and thermal characterization of an inter-strata liquid cooling solution for 3D ICs," Microsystem Technologies, vol. 18, 2012, pp. 225-235.

Cool Technology Solutions, url: http://www.cooltechnologysolutions.com.

Solutions in Ceramic Technologies, url: http://www.sct-ceramics.fr/index-En.php.

\* cited by examiner

COOLED ELECTRONICS PACKAGE WITH STACKED POWER ELECTRONICS COMPONENTS

FIELD OF THE INVENTION

The invention relates to the field of packaging and cooling of power electronics components. In particular, the invention relates to an electronics package.

BACKGROUND OF THE INVENTION

The switching speed of power semiconductors is limited by parasitic inductances and capacitances of the electronics package carrying the power semiconductors. One solution for circuit boards to reduce the parasitics is to embed the power semiconductors and their connections within the substrate of the circuit board. This permits to create short, metallic interconnections, which may minimise distortions due to parasitics.

An embedded technology also may provide the opportunity to embed EMI shield(s) with a high level of isolation from inductively and capacitively coupled noise into the circuit board, which may eliminate the need for an additional surface-mounted shield. With higher power and higher switching frequencies, for example achievable with wide bandgap semiconductors, the parasitic inductance problems may become worse.

For example, WO 2012/072212 A2 shows a power electronics package, with several electrically conducting layers, which are laminated together with a prepreg material, in which also a semiconductor chip is embedded.

However, packaging the power semiconductor chips very dense together may be challenging in the view of cooling the power semiconductors and a thermal management of the electronics package. Placing chips closer together may reduce the parasitic problem but the semiconductor chips as heat sources are more proximate to one another which may result in poor thermal spreading and hot spots. While the global temperature may not be excessive, the local hot spot temperature at a semiconductor chip may prohibit an efficient operation and may reduce the lifetime of the semiconductor chip.

It is known to cool an electronics package from one side with a cooling body. However, this only allows a one-sided cooling and may prevent chip stacking within the electronics package. There are also other solutions, how electronics packages may be cooled. For example, U.S. 2012/0228779 A1 relates to a chip comprising vertical fluid vias.

Further, a printed circuit board provided with a heat circulating medium is known from U.S. 2008/0286531 A1.

DESCRIPTION OF THE INVENTION

It is an objective of the invention to provide an electronics package with densely packed power electronics components such as semiconductor chips, which is effectively cooled without degrading the electrical performance.

This objective is achieved by the subject-matter of the independent claims. Further exemplary embodiments are evident from the dependent claims and the following description.

The invention relates to an electronics package, which may be an assembly comprising power electronics components, such as semiconductor chips, and electrical conductors which are mechanically and electrically interconnected. The electrical conductors may be provided in several layers, which are laminated together with isolation material, such as prepreg material. The power electronics components may be provided inside the electronics package and/or may be arranged in several layers. In such a way, the electronics package may be seen as a multi-layer circuit board.

The electronics package and/or the power electronics components may be able to process currents of more than 10 A and/or more than 1 kV.

According to an embodiment of the invention, the electronics package comprises an electrically conducting support layer; at least one electrically conducting outer layer; at least two power electronics components arranged on different sides of the support layer and electrically interconnected with the support layer and with the at least one outer layer; an isolation material, in which the support layer and the at least two power electronics components are embedded, wherein the support layer and the at least one outer layer are laminated together with the isolation material; and a cooling channel for conducting a cooling fluid through the electronics package, wherein the cooling channel runs between the at least two power electronics components through the support layer.

The electronics package may comprise several layers of electrically conducting material, such as copper or aluminium. These layers may be laminated together with electrically isolating material, such as prepreg material, to form the electronics package.

In the electronics package and in particular into the isolation material, several power electronics components may be embedded. The power electronics components may be provided on two sides of a central support layer, which may mechanically support at least some of the power electronics components and/or which may electrically interconnect at least some of the power electronics components.

Furthermore, some or all of the power electronics components may be arranged between the support layer and one or two outer layers, which also may be electrically connected with the power electronics components and/or which may provide electrical contact areas for the electronics package. Each of the outer layers may provide planar sides of the electronics package. Electrically conducting parts of the support layer and/or the one or two outer layers may be provided by so-called lead frames, i.e. structured metal plates.

In other words, the power electronics components may be stacked in the electronics package. For example, two power electronics components may be stacked with respect to each other in the same direction, in which the layers of the electronics package are stacked. Through internally stacking the power electronics components, a high density of active and passive components may be achieved, while the volume of the electronics package is only marginally increased compared to an electronics module without stacked power electronics components. Reducing the distance between power electronics components and connections may result in a low parasitic inductance.

Furthermore, in the electronics package, a cooling channel may be arranged, through which a cooling fluid, such as water, may be pumped. The cooling channel may be arranged between stacked power electronics components and/or may be provided inside the support layer. Thus, there may be only a small distance from the cooling channel to each power electronics component, which then may be efficiently cooled. The cooling channel may allow the coolant to pass closer to the power electronics components resulting in a lower thermal resistance. Additionally, the distances between the power electronics components and the cooling channel all may be substantially equal providing equal cooling for all power electronics components. Also, hot spots inside the electronics package may be cooled more specifically.

The cooling channel may be a microfluidic channel passing through the support layer for the power electronics components. For example, the channel may have a diameter of less than 1 mm, such as 50 µm, 100 µm, etc.

Furthermore, with the integrated cooling channel, it is possible to eliminate the need for a directly attached, not integrated primary heat sink. Without the primary heat sink, there is no capacitive coupling between the primary heat sink and the electronics package, no need for thermal interface materials and a mechanical fixation to the electronics package. The overall weight of the electronics package may be reduced.

Also the cooling channel already may be integrated into the electronics module by the manufacture of the electronics package. There is no need to add and/or attach external heat sinks to the electronics package later.

There are several possibilities, how the support layer is structured. The support layer may comprise several electrically conducting components, which are electrically isolated from each other. Alternatively, the support layer may comprise one single electrically conduction component.

According to an embodiment of the invention, the support layer comprises an isolation element for electrically isolating two electrically conducting components of the support layer, wherein the cooling channel runs through the isolation element. In such a way, the cooling channel may be provided in an electrically isolating component.

Furthermore, at least parts of the cooling channel, which extends in a direction substantially parallel to the different layers of the electronics package, may be provided in a part, which may be easy to manufacture with an internal channel. For example, the isolation element may be made of polymer. The cooling channel may be provided in the isolation element before the isolation element is integrated into the support layer.

It also may be possible that the isolation element is made of ceramics.

According to an embodiment of the invention, the isolation element is an isolation layer arranged between two electrically conducting sublayers of the support layer. The electrically conducting sublayers and/or the isolation layer may extend in the same direction as the support layer and the at least one outer layer.

According to an embodiment of the invention, the isolation element separates two electrically conducting components of the support layer, which are arranged side by side along a longitudinal direction of the support layer. It also may be possible that the support layer comprises an insulation section between islands of the support layer, i.e. electrically conducting components of the support layer, which comprise a power electronics component electrically connected to each side.

According to an embodiment of the invention, the power electronics components comprises at least one of a semiconductor chip, a resistor and/or a capacitor. For example, one or more of the at least two power electronics components may be a semiconductor chip. Due to the reduced parasitic inductance, the electronics package may be adapted for fast switching. Furthermore, due to the effective cooling, the electronics package may be provided with one or more wide bandgap semiconductors. One or more of the semiconductor chips may be based on a wide bandgap semiconductor such as SiC or GaN.

According to the invention, at least a part of the cooling channel is provided by an electrically conducting component of the support layer. It may be possible that the cooling channel has one or more parts directly extending through one or both of the electrically conducting components. Also this part of the cooling channel may be manufactured into the electrically conducting component before it is joined with the other components of the electronics package.

It has to be noted that parts of the cooling channel extending through the electrically conducting component may extend in a direction substantially parallel to the support layer and/or outer layer and/or may extend in a substantially vertical direction with respect to these layers.

According to an embodiment of the invention, the cooling channel comprises at least one cooling via, which extends along a stacking direction of the electronics package. A via may refer to a conductor (conducting cooling fluid or conducting current) interconnecting two different layers of the electronics package. Such a via may extend in a substantially vertical direction with respect to the support layer and/or outer layer.

A cooling via may extend through conduction material and/or through isolation material. A cooling via may extend to the outside of the electronics package, where cooling fluid may be introduced into the cooling channel.

According to an embodiment of the invention, the electronics package further comprises fluid connectors interconnected with the cooling channel for connecting a cooling fluid source with the cooling channel. For example, the fluid connectors, which may be plugs, may be attached to ends of cooling vias. The fluid connectors are arranged on one side of the electronics package and/or may protrude from this side. It may be possible that the fluid connectors are provided on a side of the package at which an outer layer is provided or are provided on a narrow side of the electronics package.

According to an embodiment of the invention, the electronics package further comprises electrically conducting vias, which interconnect the at least two power electronics components with the at least one outer layer and/or with electrically conducting components of the support layer. These vias may run substantially vertical with respect to the different layers.

According to an embodiment of the invention, the support layer and/or an electrically conducting component of the support layer comprise at least one cavity, in which at least one of the power electronics components is arranged. The cavity may have a depth which is equal to the height of the power electronics component, such that a surface of the power electronics component is flush with a surface of the support layer and/or an electrically conducting component of the support layer.

According to an embodiment of the invention, at least two power electronics components are bonded at different sides to an electrically conducting component of the support layer through which the cooling channel runs. For example, the component may have cavities at both sides, in which the power electronics components are bonded. The power electronics components may be stacked on the same lead frame.

According to an embodiment of the invention, a power electronics component is bonded to the support layer such that a gate electrode faces towards an outer layer. The gate electrode then may be directly connected to a respective contact area in the outer layer with a via.

According to an embodiment of the invention, a power electronics component is a semiconductor chip arranged as a flip chip, such that a gate electrode faces towards the support layer. This may be useful for interconnecting the semiconductor chip with the support layer in a specific way. The power electrode of the semiconductor chip may be connected with vias with the support layer, such that space for a conductor for electrically connecting the gate electrode to the outside of the electronics module is provided.

According to an embodiment of the invention, the electronics package further comprises two outer layers providing contact areas on both sides of the electronics package. In such a way, several equally designed power electronics packages may be easily stacked and electrically interconnected.

It may be possible that the electronics package comprises a circuit that may be used in a rectifier or inverter, such as a half-bridge. In this case, at least four semiconductor chips may be arranged inside the electronics module. Two of these semiconductor chips may be stacked in a vertical direction.

According to an embodiment of the invention, the electronics package further comprises two semiconductor switch chips and two diode chips, wherein each diode chip is electrically interconnected in parallel to one of the switch chips and the two switch chips are electrically connected in series such that the electronics package provides a half bridge. It is possible that the diode chips are replaced with controllable semiconductor switch chips. A semiconductor switch chip may comprise a transistor (such as an IGBT) or thyristor.

There are several possibilities, how the switch chips and diode chips are arranged inside the electronics package. For example, two chips arranged side by side in a longitudinal direction of the layers may be electrically interconnected by the support layer. Alternatively or additionally, two chips stacked in a vertical direction may be electrically interconnected by the support layer.

According to an embodiment of the invention, a first switch chip and a first diode chip electrically connected in parallel are bonded on a first side of the support layer to a first electrically conducting sublayer of the support layer, which is separated by an isolation layer from a second electrically conducting sublayer of the support layer, wherein a second switch chip and a second diode chip electrically connected in parallel are bonded on a second side of the support layer to the second sublayer, and wherein the cooling channel is provided at least partially in the isolation layer. In this case, the switch chips may be stacked and the diode chips may be stacked.

According to an embodiment of the invention, a first switch chip and a first diode chip electrically connected in parallel are bonded to two opposite sides of a first electrically conducting component of the support layer, which first component is separated from a second electrically conducting component of the support layer by an isolation element, wherein a second switch chip and a second diode chip electrically connected in parallel are bonded to two opposite sides of the second electrically conducting component, and wherein the cooling channel runs through the first component, the isolation element and the second component. This arrangement provides the possibility to stack a switch chip and a diode chip. This may provide a more even temperature distribution inside the electronics package.

According to an embodiment of the invention, a first switch chip and a first diode chip electrically connected in parallel are bonded on a first side of the support layer to an electrically conducting layer of the support layer, wherein a second switch chip and a second diode chip electrically connected in parallel are provided on a second side of the support layer, wherein the second semiconductor switch chip is electrically connected in a flip chip arrangement to the electrically conducting layer and the second diode chip is bonded to the electrically conducting layer, and wherein the cooling channel is provided in the electrically conducting layer. This arrangement provides the possibility to manufacture the support layer from one single component, into which the cooling channel is integrated. No isolation elements inside the support layer may be necessary.

These and other aspects of the invention will be apparent from and elucidated with reference to the embodiments described hereinafter.

BRIEF DESCRIPTION OF THE DRAWINGS

The subject matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
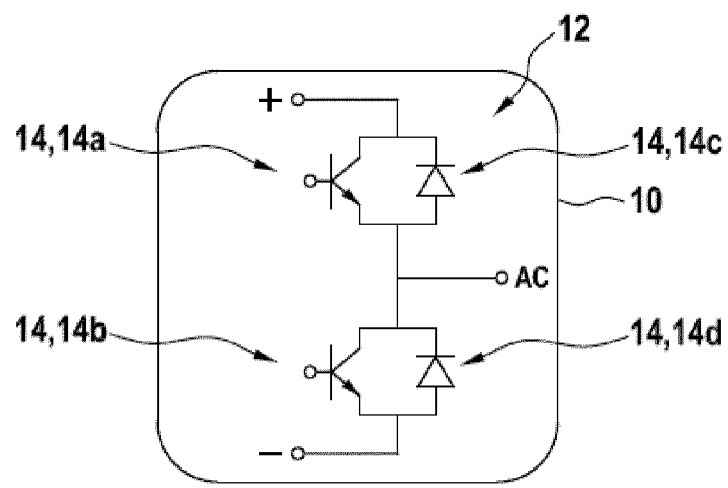
FIG. 1 shows a circuit diagram for an electronics package according to an embodiment of the invention.

FIG. 1 shows a circuit diagram of an electronics package 10. In the following, a power electronics package 10 will be described that houses a half-bridge 12 made of four power electronics components 14, in particular two semiconductor switch chips 14a, 14b and two diode chips 14c, 14d. The semiconductor switch chips 14a, 14b may be transistors or thyristors and in particular may be wide bandgap devices. In specific applications, the two diode chips 14c, 14d also may be replaced with semiconductor switch chips.

The two semiconductor switch chips 14a, 14b are connected in series between a DC+ and a DC− contact and provide an AC contact between them. Each of the diode chips 14c, 14d is connected in parallel to one of the semiconductor switch chips 14a, 14b.

In general, here and in the following, the electronics package 10 may comprise any other circuit made of at least two power electronics components 14. For example, it may be possible that only one arm of the half-bridge 12 is realized with a semiconductor switch chip 14a and a diode chip 14c inside the electronics package 10. A further possibility is, that four diodes interconnected to a rectifier are provided by the electronics package 10. It also may be possible that more than 4 power electronics components 12 are provided by the electronics package 10, for example two or three half-bridges 12 for a complete inverter.

Figure 2:
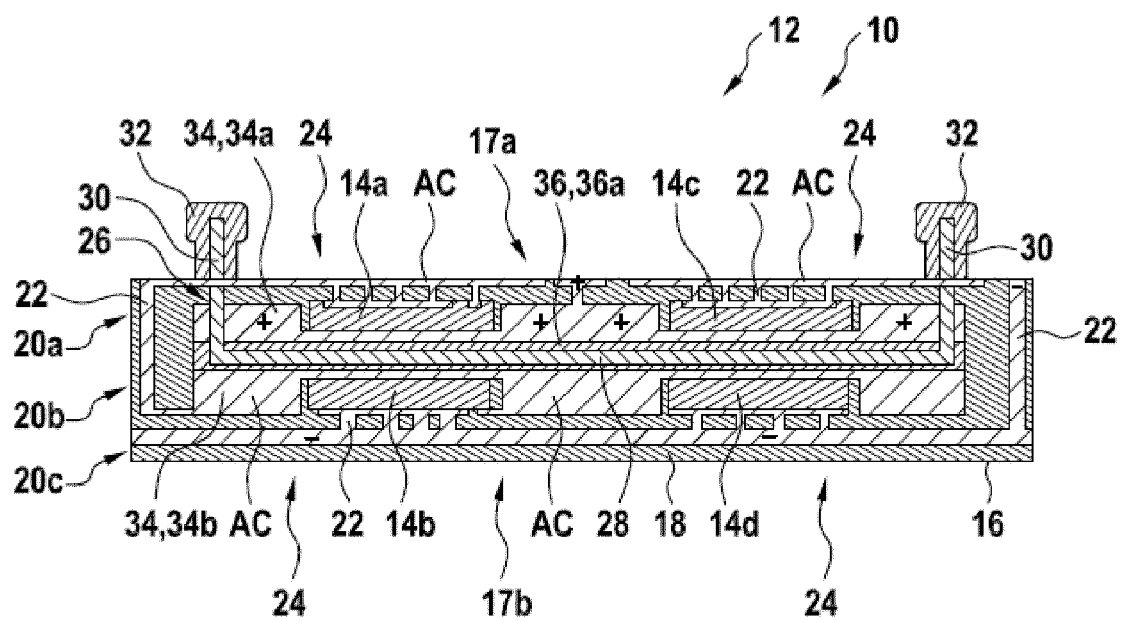
FIG. 2 schematically shows a cross section of an electronics package according to an embodiment of the invention.

FIG. 2 shows an electronics package 10 in a cross-sectional view. It has to be noted that dimensions and distances in FIG. 2 and the following figures are not true to scale. The electronics package has a longitudinal body 16 being much longer in a horizontal direction than in a vertical direction. The body 16 has two substantially planar sides 17a, 17b. On the upper side 17a, an AC contact area, a DC+ contact area and a DC− contact area are provided. On the lower side 17b, on isolation material 18 of the electronics package 10 is provided.

It has to be understood that the terms "upper", lower", "horizontal" and "vertical" may only refer to the orientation of the electronics package 10 but not to the orientation of the electronics package 10 with respect to the earth. For example, it may be possible that in a final position, the upper side 17a may face downwards toward the earth.

The electronics package 10 comprises several electrically conducting layers 20a, 20b, 20c, which are laminated together with the isolation material 18, which, for example, may be a prepreg material, with, for example, epoxy resin. In this sense, the electronics package 10 may be seen as a multi-layered circuit board. For example, each of the electrically conducting layers 20a, 20b, 20c may comprise one or more lead frames, which are structured in such a way for providing horizontal conductors inside the electronics package 10.

Furthermore, the electronics package 10 comprises vias 22, which are vertical aligned electrical conductors, which, for example, may interconnect different layers 20a, 20b, 20c with each other and/or may interconnect a power electronics component 14 with a layer 20a, 20b, 20c.

For example, the electrically conducting parts of the layers 20a, 20b, 20c and/or the vias 22 may be made of copper and/or aluminium.

The support layer 20b, which is sandwiched between the two outer layers 20a, 20c, is designed to support and electrically interconnect the power electronics components 14. One, some or all of the power electronics components 14 may be bonded to the support layer 20b. For example, the support layer 20b may have cavities 24, in which the power electronics components 14 are mounted. Each cavity 24 may have a specific depth, which may depend on the thickness of the respective power electronics component 14, such that the top side of the power electronics components 14 on one side of the support layer 20b are uniplanar. This co-planar arrangement may facilitate the lamination of the electronics package 10.

It has to be noted that the power electronics components 14 all may be completely embedded into the electronics package 10 and in particular into the isolation material 18.

The power electronics components 14 are arranged on different sides of the support layer 20b. In particular, a pair of power electronics components 14 is stacked in the vertical direction, i.e. orthogonal to a longitudinal (i.e. horizontal) direction of the layers 20a, 20b, 20c. In FIG. 1, the two semiconductor switch chips 14a, 14b are stacked and the two diode chips 14c, 14d are stacked.

As a further example, two of the power electronics components 14 may be semiconductor chips and two of the power electronics components 14 may be passive components such as resistors and/or capacitors. For example, the electronics package 10 may comprise a semiconductor chip and a passive component (such as a resistor or a capacitor) on different sides of a support layer.

The upper and/or the lower outer layers 20a, 20c may provide the contact areas for AC, DC+ and DC−. In FIG. 2, this is only the case for the upper layer 20a.

Furthermore, the electronics package 10 comprises a cooling channel 26, which comprises a part 28 that runs horizontally, i.e. substantially parallel to the layers 20a, 20b, 20c through the support layer 20b. The cooling channel 26 and in particular the part 28 are arranged such that it runs between the stacked power electronics components 14 and thus is adapted to transfer the heat generated by the power electronics components 14 very effectively away from the power electronics components 14. This allows an increased density of power electronics components and reduces the thermal resistance by introducing a coolant directly to hot spots in the electronics package 10.

The ends of the part 28 end in cooling vias 30, which, similar to the electrically conducting vias 22, extend in the vertical direction. The cooling vias 30 may be provided as channel in the material of the support layer 20b and/or the outer layer 20a. Furthermore, the cooling vias 30 may be provided as channel in the isolation material 18.

Both cooling vias 30 extend to the upper side 17a of the electronics package 10, where they are connected with cooling or fluid connectors 32, which may be connected with a coolant source. The coolant (a fluid) may be pumped through the cooling channel 26. By putting the cooling channel 26 between the power electronics components 14, this allows the chips 14 to be stacked vertically and allows denser, more efficient packaging.

It may be possible that the electronics package 10 comprises several cooling channel parts 28, which, for example, run side by side in the horizontal direction, i.e. longitudinal direction of the support layer 20b, and/or may be interconnected inside the electronics module 10 to thicker channel parts, which are interconnected with the fluid connectors 32.

In this case, the cooling channel parts 28 may be microchannels having a diameter between 50 µm and 500 µm. The thicker channels collecting and distributing the coolant may have a diameter up to 2 mm.

As shown in FIG. 2, the support layer 20b may be separated into zones of differential potential and/or may comprise several electrically conducting components 34, which are mechanically interconnected with an isolation element 36. In FIG. 2, the components 34 are electrically conducting sublayers 34a, 34b, which are mounted to each other by an isolation layer 36a. In FIG. 2, the upper sublayer 34a of the support layer 20b electrically interconnects the semiconductor switch chip 14a and the diode chip 14c and is on DC+ potential. The lower sublayer 34b of the support layer 20b electrically interconnects the semiconductor switch chip 14b and the diode chip 14d and is on AC potential.

The isolation layer 36a may be made of a polymer or of ceramics, i.e. an electrically non-conducting material. For example, the isolation element 36 may be a ceramic and may be brazed for attaching it to the metal material of the components 34.

The cooling channel 26 and in particular the horizontal part 28 extends though the isolation layer 36a. The cooling vias 30, connected to the end of the horizontal part 28, may start in the isolation layer 36a and/or may extend through the upper sublayer 34a.

Figure 3:
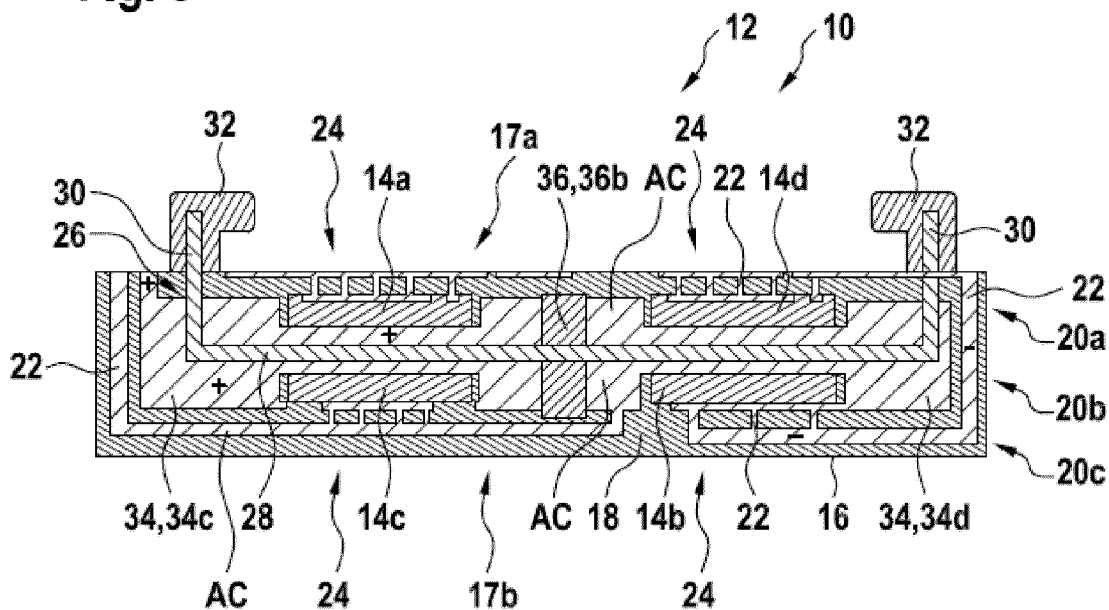
FIG. 3 schematically shows a cross section of an electronics package according to a further embodiment of the invention.

FIG. 3 shows an alternative embodiment, where the electrically conducting components 34, 34c, 34d of the support layer 20c are arranged side by side in the horizontal direction. The isolation element 36 thus may be an isolation block 36b arranged between the two components 34c, 34d. It also may be that the isolation element 36 is provided by a tube of non-conducting material (for example such as ceramics) embedded into the isolation material 18.

In FIG. 3, the first electrically conducting component 34c comprises two cavities 24 on opposing sides, in which the semiconductor switch chip 14a and the diode chip 14c are mounted. The first electrically conducting component 34c may be on DC+ potential. Also, the second electrically conducting component 34d comprises two cavities 24 on opposing sides, in which the semiconductor switch chip 14b and the diode chip 14d are mounted. The second electrically conducting component 34d may be on AC potential.

The horizontal part 28 of the cooling channel extends through the first component 34c between the chips 14a, 14c, through the isolation block 36b and through the second component 34d between the chips 14b, 14d.

Figure 4:
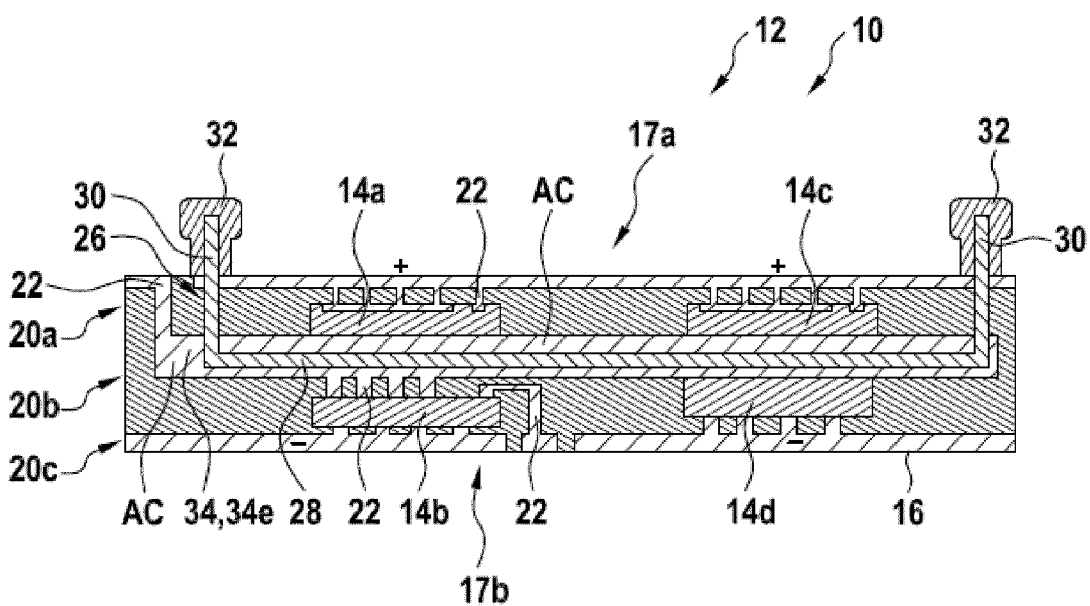
FIG. 4 schematically shows a cross section of an electronics package according to a further embodiment of the invention.

FIG. 4 shows a further embodiment of an electronic package with a support layer 20b that comprises a single layer 34e as electrically conducting component 34, which may be on AC potential. Furthermore, the support layer 20b has flat sides (without cavities) to which the power electronics components 14 are connected. Three of the power electronics components 14, i.e. the chips 14a, 14c and 14d are mounted and/or bonded to the support layer 20c. The semiconductor switch chip 14b is arranged as a flip chip, i.e. in such a way that the side with the gate contact faces towards the support layer 20b. The semiconductor chip 14b is electrically connected with vias 22 with the support layer 20b, such that space for connecting the gate is present.

In FIG. 4, also the lower side 17b of the electronics package 10 provides contact areas for electrically connecting the electronics package 10. These contact areas may be provided by the lower layer 20c. Such an arrangement also may be possible with the embodiments of FIGS. 2 and 3. Vice versa, the embodiment of FIG. 4 alternatively may have a layer of isolation material 18 on the lower side 17b.

In FIG. 4, the cooling channel 26 and in particular the horizontal part 28 extend through the electrically conducting layer 34e. For example, the cooling channel 26 and/or the part 28 may have been machined into the layer 34e, before the power electronics components 14 where attached to the layer 34e and the layer 34e was laminated with the outer members of the electronics package.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 electronics package
12 half-bridge
14 power electronics component
14a, 14b semiconductor switch chip
14c, 14d diode chip
+ DC+ contact/potential
− DC− contact/potential
AC AC contact/potential
16 body of electronics package
17a upper side
17b lower side
18 isolation material
20a upper, outer layer
20b support layer
20c lower, outer layer
22 electrically conducting via
24 cavity
26 cooling channel
28 horizontal part of cooling channel
30 cooling via
32 fluid connector
34 electrically conducting component
34a upper sublayer
34b lower sublayer
34c first electrically conducting component
34d second electrically conducting component
34e single layer
36 isolation element
36a Isolation layer
36b isolation block

The invention claimed is:

1. An electronics package, comprising:
an electrically conducting support layer;
at least one electrically conducting outer layer;
at least two power electronics components arranged on different sides of the support layer and electrically interconnected with the support layer and with the at least one outer layer;
an isolation material, in which the support layer and the at least two power electronics components are embedded, wherein the support layer and the at least one outer layer are laminated together with the isolation material;
a cooling channel for conducting a cooling fluid through the electronics package, wherein the cooling channel runs between the at least two power electronics components through the support layer; and
wherein at least a part of the cooling channel is provided by an electrically conducting component of the support layer.

2. The electronics package of claim 1,
wherein the support layer comprises an isolation element for electrically isolating two electrically conducting components of the support layer;
wherein the cooling channel runs through the isolation element.

3. The electronics package of claim 2,
wherein the isolation element is an isolation layer arranged between two electrically conducting sublayers of the support layer.

4. The electronics package of claim 2,
wherein the isolation element separates two electrically conducting components of the support layer, which are arranged side by side along a longitudinal direction of the support layer.

5. The electronics package of claim 1,
wherein the power electronics components comprises at least one of a semiconductor chip, a resistor and/or a capacitor.

6. The electronics package of claim 1,
wherein the cooling channel comprises at least one cooling via, which extends along a stacking direction of the electronics package.

7. The electronics package of claim 1, further comprising:
fluid connectors interconnected with the cooling channel for connecting a cooling fluid source with the cooling channel; and
wherein the fluid connectors are arranged on one side of the electronics package.

8. The electronics package of claim 1, further comprising:
electrically conducting vias, which interconnect the at least two power electronics components with the at least one outer layer and/or with electrically conducting components of the support layer; and/or
wherein the support layer comprises at least one cavity, in which at least one of the power electronics components is arranged.

9. The electronics package of claim 1,
wherein at least two power electronics components are bonded at different sides to an electrically conducting component of the support layer through which the cooling channel runs.

10. The electronics package of claim 1,
wherein a power electronics component is bonded to the support layer such that a gate electrode faces towards an outer layer; and/or
wherein a power electronics component is a semiconductor chip arranged as a flip chip, such that a gate electrode faces towards the support layer.

11. The electronics package of claim 1, further comprising:
two outer layers providing contact areas on both sides of the electronics package.

12. The electronics package of claim 1, further comprising:
two semiconductor switch chips and two diode chips;
wherein each diode chip is electrically interconnected in parallel to one of the switch chips and the two switch chips are electrically connected in series such that the electronics package provides a half bridge.

13. The electronics package of claim 12,
wherein a first switch chip and a first diode chip connected in parallel are bonded on a first side of the support layer to a first electrically conducting sublayer of the support layer which is separated by an isolation layer from a second electrically conducting sublayer of the support layer;
wherein a second switch chip and a second diode chip connected in parallel are bonded on a second side of the support layer to the second sublayer;
wherein the cooling channel is provided at least partially in the isolation layer.

14. The electronics package of claim 12,
wherein a first switch chip and a first diode chip connected in parallel are bonded to two opposite sides of a first electrically conducting component of the support layer, which first component is separated from a second electrically conducting component of the support layer by an isolation element;
wherein a second switch chip and a second diode chip connected in parallel are bonded to two opposite sides of the second electrically conducting component;
wherein the cooling channel runs through the first component, the isolation element and the second component.

15. The electronics package of claim 12,
wherein a first switch chip and a first diode chip connected in parallel are bonded on a first side of the support layer to an electrically conducting layer of the support layer;
wherein a second switch chip and a second diode chip connected in parallel are provided on a second side of the support layer, wherein the second switch chip is electrically connected in a flip chip arrangement to the electrically conducting layer and the second diode chip is bonded to the electrically conducting layer;
wherein the cooling channel is provided in the electrically conducting layer.

16. The electronics package of claim 2, wherein the power electronics components comprises at least one of a semiconductor chip, a resistor and/or a capacitor.

17. The electronics package of claim 3, wherein the power electronics components comprises at least one of a semiconductor chip, a resistor and/or a capacitor.

18. The electronics package of claim 2, wherein the cooling channel comprises at least one cooling via, which extends along a stacking direction of the electronics package.

19. The electronics package of claim 3, wherein the cooling channel comprises at least one cooling via, which extends along a stacking direction of the electronics package.

20. The electronics package of claim 4, wherein the cooling channel comprises at least one cooling via, which extends along a stacking direction of the electronics package.

* * * * *